United States Patent
Lock

(10) Patent No.: US 7,528,932 B2
(45) Date of Patent: May 5, 2009

(54) SLM DIRECT WRITER

(75) Inventor: Tomas Lock, Göteborg (SE)

(73) Assignee: Micronic Laser Systems AB, Taby (SE)

( * ) Notice: Subject to any disclaimer, the term of this patent is extended or adjusted under 35 U.S.C. 154(b) by 491 days.

(21) Appl. No.: 11/312,629

(22) Filed: Dec. 21, 2005

(65) Prior Publication Data

US 2007/0139757 A1    Jun. 21, 2007

(51) Int. Cl.
G03B 27/42    (2006.01)
G02B 26/00    (2006.01)

(52) U.S. Cl. .................. 355/53; 355/67; 250/492.22; 250/492.23; 382/266; 716/21; 430/30; 430/322; 358/1.9; 359/197; 359/201; 359/205; 359/221; 359/223; 359/295; 359/298

(58) Field of Classification Search ............ 250/492.22, 250/492.23; 382/266; 716/21; 430/30, 322; 355/53, 67; 359/196, 197, 201, 205, 212–221, 359/223–226, 290–292, 295, 298, 855; 358/1.9
See application file for complete search history.

(56) References Cited

U.S. PATENT DOCUMENTS

| | | | |
|---|---|---|---|
| 6,376,619 B1 | 4/2002 | Halverson et al. | 359/298 |
| 6,428,940 B1 * | 8/2002 | Sandstrom | 430/22 |
| 6,700,095 B2 * | 3/2004 | Sandstrom et al. | 219/121.73 |
| 6,894,765 B2 * | 5/2005 | Mackey et al. | 355/69 |
| 2003/0160980 A1 | 8/2003 | Olsson et al. | 358/1.9 |
| 2005/0084766 A1 * | 4/2005 | Sandstrom | 430/5 |
| 2005/0128565 A1 * | 6/2005 | Ljungblad | 359/291 |
| 2005/0168851 A1 * | 8/2005 | Sandstrom | 359/855 |
| 2005/0219502 A1 * | 10/2005 | Sandstrom et al. | 355/77 |
| 2006/0039651 A1 * | 2/2006 | Sandstrom | 385/37 |
| 2008/0062504 A1 * | 3/2008 | Karlin | 359/291 |

FOREIGN PATENT DOCUMENTS

WO    WO 01/18606 A1    3/2001

* cited by examiner

*Primary Examiner*—Evelyn A. Lester
(74) *Attorney, Agent, or Firm*—Harness, Dickey & Pierce, P.L.C.

(57) ABSTRACT

The present invention relates to an apparatus (100) for patterning a workpiece arranged at an image plane and sensitive to electromagnetic radiation, comprising a source emitting electromagnetic radiation onto an object plane and at least two spatial light modulators each comprising numerous of object pixels, adapted to receive said electromagnetic radiation at said object plane and to relay said electromagnetic radiation toward said workpiece, wherein said electromagnetic radiation is split into at least two beams, which beams will impinge on different spatial light modulators, by a beam splitting device arranged at an optical plane between said spatial light modulators and an illuminator pupil or a conjugate optical plane. The invention also relates to a method for patterning a workpiece with a plurality of spatial light modulators.

28 Claims, 4 Drawing Sheets

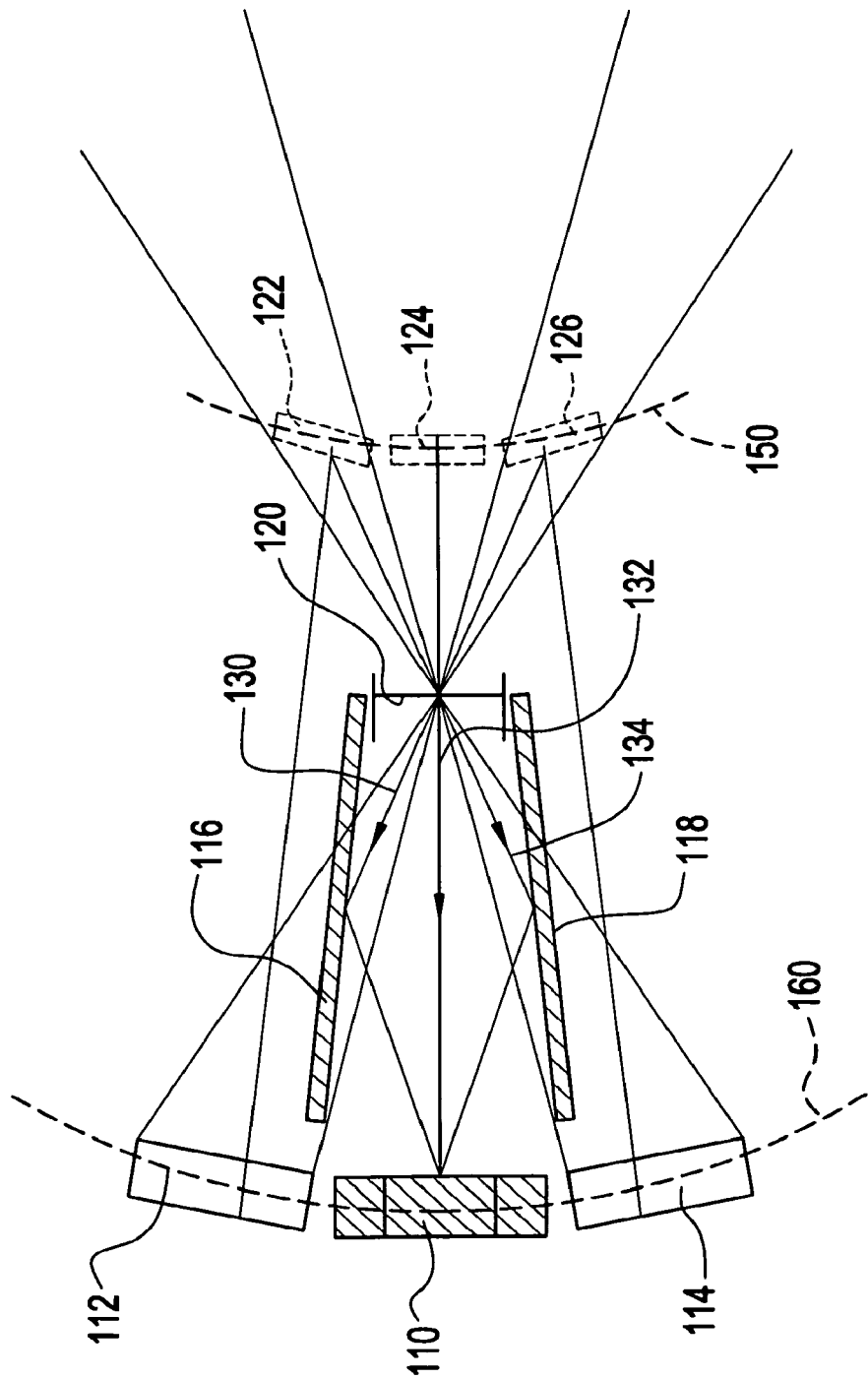

SLM DIRECT WRITER

TECHNICAL FIELD

The present invention relates to optical lithography, in particular it relates to a method and a device for direct writing of patterns using at least one spatial light modulator (SLM).

BACKGROUND OF THE INVENTION

Modern UV-lithography is searching for new highly parallel writing concepts. Spatial light modulation with optical MEMS devices offers such possibilities. An SLM chip may comprise a DRAM-like CMOS circuitry with several million individually addressable pixels on top. Said pixels are deflected due to a difference in electrostatic force between a mirror element and an address electrode. A pattern generator using an SLM is described in U.S. Pat. No. 6,373,619, which is assigned to the same assignee as this invention. U.S. Pat. No. 6,373,619 discloses in short a small field stepper, which exposes a series of images of the SLM. A workpiece is arranged on a stage, which is continuously moving and a pulsed electromagnetic radiation source (which could be a pulsed laser, a flash lamp, a flash from a synchrotron light source, etc) flashes and freezes an image of the SLM on the workpiece. The SLM is reprogrammed with a new pattern before each flash so a contiguous image is composed on the workpiece.

In the past, integrated circuits have been manufactured more or less solely by using a number of masks or reticles comprising a pattern of a layer in said integrated circuit. In today's integrated circuits the number of layers could be larger than 30. Said Masks or reticles may be prepared in lithographical manner by using for example electron beams or laser beams for exposing a layer of material sensitive for the type of beam chosen. The mask material, which is most commonly transmissive, may have attached on top of one of its sides a thin layer of opaque material. In said thin layer of opaque material the pattern of one layer of said integrated circuit may be created. The mask has typically N times larger pattern than the pattern to be printed on the semi-conducting substrate for forming said integrated circuit. The reduction in size may be performed in a stepper or a scanner, which may use the mask(s) for forming said integrated circuit.

More recently, the need to manufacture integrated circuits by means other than using a conventional mask has developed for a number of reasons, for example the price of manufacturing mask(s) has increased due to its complexity to manufacture, small-scale development requiring only a small number of integrated circuits, etc.

Unfortunately, all of the present known techniques for forming integrated circuits without using conventional masks or reticles have drawbacks and limitations.

For example, most direct-writers known in the art are based on electron beams, typically so called shaped beams, where the pattern is assembled from flashes, each defining a simple geometrical figure. Other systems are known which use raster scanning of Gaussian beams. By using a conventional mask writer, which uses beams of electrons or laser beams for forming the pattern on a workpiece, may be limited to relatively low scanning speeds, and, perhaps worst of all, may only scan a single dimension.

SLM writers disclosed in other patent applications, such as WO 01/18606 and U.S. patent application Ser. No. 09/954, 721 (now U.S. Pat. No. 7,302,111), by one of the assignees of the present invention and hereby incorporated by reference, are related to raster scanning in the sense that it permits a bitmap pattern, but distinct by printing an entire frame of pattern in one flash instead of building the pattern from individual pixels.

A spatial light modulator (SLM) comprises a number of modulator elements, which can be set in a desired way for forming a desired pattern. Reflective SLMs may be exposed to any kind of electromagnetic radiation, for example DUV or EUV for forming the desired pattern on the mask or any other workpiece.

A direct-writing pattern generator for writing certain layers in a semiconductor design directly from data would have a high value to the industry. However, the complexity of modern chips is extremely high and getting higher by every new technology generation. The direct-writer must write the complex pattern not one, but millions of times on a 300 mm wafer.

A direct write machine that may expose LCD large area substrates must have a write time of around one minute in order to be competitive. This time is very short compared to the "day" needed to make a mask. A writing speed is therefore very large (1000× or more) compare to present technology. One major obstacle is the stage speed, which must have a speed that is "too large". This may however be avoided by writing in a large width, but this may require a large number of optical channels and lenses which both increases the cost and complexity.

The mechanical motion may also be a problem with large stage speeds as the mass increases while the time allowed for the turn around decreases drastically. The shorter turnaround time and the increased forces may also induce grater vibrations and resonance at higher frequencies in the mechanical structure. There may also be the ever larger problem of mechanical systems to settle properly before start writing.

An increased turnaround time also consumes valuable time needed for the writing itself.

SUMMARY OF THE INVENTION

Accordingly, it is an object of the present invention to provide a direct writing method and apparatus, which prints features on a workpiece essentially faster and/or more flexible than prior art.

This object, among others, is according to a first aspect of the invention, attained by an apparatus for patterning a workpiece arranged at an image plane and sensitive to electromagnetic radiation, comprising the actions of: emitting electromagnetic radiation onto an object plane, distributing the emitted electromagnetic radiation through a series of illuminations directions upon a single area in an object plane, directing said series of illumination directions from at least one spatial light modulator at said single area in said object plane toward said workpiece, wherein at least two consecutive images coming from said at least one spatial light modulator are laterally displaced from each other on said workpiece.

The invention also relates to a method for patterning a workpiece arranged at an image plane and sensitive to electromagnetic radiation, comprising: a device to distribute electromagnetic radiation in at least two different illumination directions upon a single area in an object plane comprising at least one spatial light modulator, wherein said at least two illumination directions give rise to at least two laterally displaced images from said at least one spatial light modulator at said image plane.

Further characteristics of the invention, and advantages thereof, will be evident from the detailed description of preferred embodiments of the present invention given hereinafter and the accompanying FIGS. 1-6, which are given by way of illustration only, and thus are not limitative of the present invention.

BRIEF DESCRIPTION OF THE DRAWINGS

FIG. 6 illustrates a third example embodiment according to the present invention.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Further, the preferred embodiments are described with reference to an analog SLM, i.e., more than or equal to one gray level between on and off. It will be obvious to one with ordinary skill in the art that there may be situations when other SLMs than analog ones will be equally applicable; for example digital SLMs like a digital micromirror device (DMD) made by Texas instruments. Even further, the preferred embodiments are described with reference to an excimer laser source. It will be obvious to one with ordinary skill in the art that a pulsed electromagnetic radiation source other than an excimer laser may be used by the inventive method, for instance a Nd-YAG laser, ion laser, Ti sapphire laser, free electron laser or other pulsed fundamental frequency lasers, flash lamps, laser plasma sources, synchrotron light sources etc.

Figure 1A:
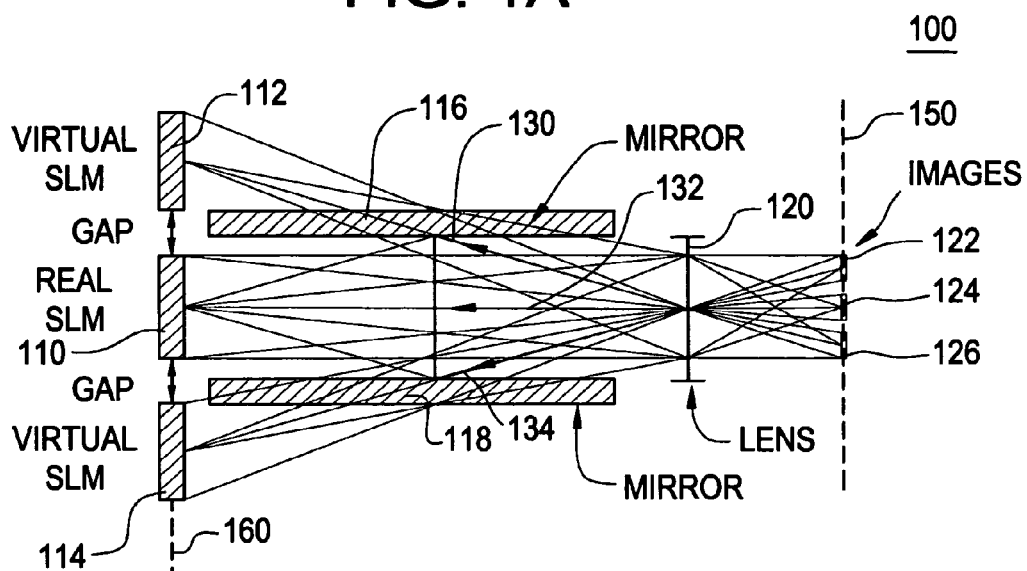
FIG. 1a depicts a schematic view from above of a first example embodiment according to the present invention.
Figure 1B:
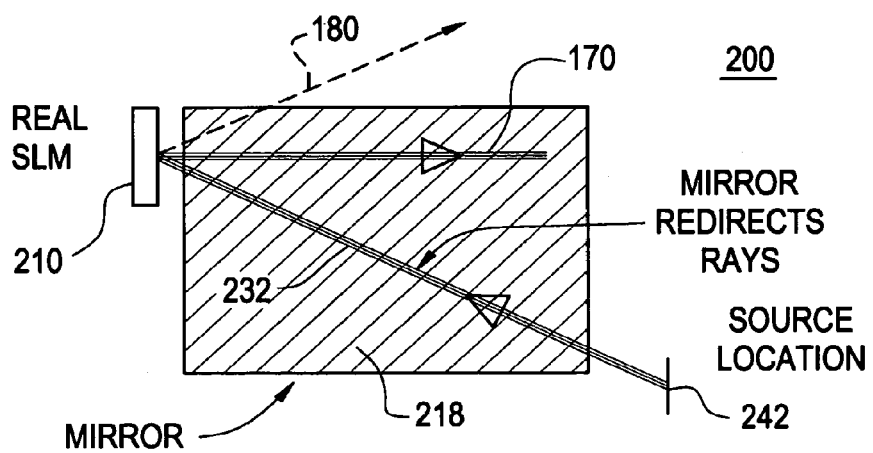
FIG. 1b depicts a schematic side view illustration of the example embodiment as illustrated in FIG. 1.

FIG. 1a depicts a schematic top view and FIG. 1b depicts a schematic side view of a first example embodiment of a pattern generator 100 according to the present invention. Said pattern generator comprising a real SLM 110, a first mirror 116, a second mirror 118, a lens 120, and a laser source 142.

Beams of electromagnetic radiation 130, 132, 134 from the electromagnetic radiation source 142 are directed onto the image plane 150 via said real SLM 110 and said lens 120. In the illustrated example embodiment said real SLM 110 is illuminated from three different illumination directions. A first beam of electromagnetic radiation 130 is illuminating the real SLM 110 from a first illumination direction. A second beam of electromagnetic radiation 132 is illuminating said real SLM 110 from a second direction. A third beam of electromagnetic radiation 134 is illuminating said real SLM 110 from a third direction. Illumination at the same time will produce 3 identical images side by side on the workpiece. In a second example embodiment said first, second and third beam of electromagnetic radiation are illuminating said real SLM 110 in sequence. Said first beam may be reflected by said first mirror 116 before impinging said real SLM 110 and may be reflected by said second mirror 118 after having been reflected by said real SLM 110. Said third beam may be reflected by said second mirror 118 before impinging said real SLM 110 and may be reflected by said first mirror 116 after having been reflected by said real SLM 110. Said first illumination direction of said real SLM 110 seems to originate from a first virtual SLM position 112. Said third illumination direction of said real SLM 110 seems to originate from a second virtual SLM position 114. Illumination in sequence may produce 3 identical images side by side on the workpiece or at least one non identical image. Three identical images may be produced by not changing the pattern on the SLM between the different illumination directions. At least one non-identical image may be produced by changing the pattern on the SLM between at least two illumination directions.

The first virtual SLM position 112, the real SLM 110 and the second virtual SLM position are positioned in an object plane 160. Images of said real SLM 110 and said first and second virtual SLM, 112 and 114 respectively, are positioned in an image plane 150. A first image 122 corresponds to the second virtual SLM position, i.e., the third illumination direction 134. A second image 124 corresponds to the real SLM, i.e., the second illumination direction 132. A third image 126 corresponds to the first virtual SLM position, i.e., the first illumination direction 130.

FIG. 1b illustrates a side view of the first example embodiment as depicted in FIG. 1a. FIG. 1b illustrates an example embodiment of a location of the laser sources, the mirror 118 and the real SLM 110. When pixels in said SLM 110 are set in a first pattern, the first impinging beam of radiation 132 onto said real SLM 110 will be relayed in a first direction 170, in the FIG. 1b, and backtracing along path 132 in FIG. 1a. When pixels in said real SLM 110 are set to a second pattern, a second impinging beam of radiation with a different angle from the origin point, 142, directed along the direction of 130 is used. This said second beam illuminates the SLM after reflection in 116 and the beam containing the image is reflected in 118, with a further path in the opposite direction of 134, creating a virtual image source location at 114. When the SLM is set to the third pattern the third source beam, angled in the opposite direction as the second beam, illuminates the SLM creating virtual image 112 along a ray path in a similar fashion to the second ray. Electromagnetic radiation not used in creating an image will proceed in the general direction of beam 180 where it would be suitably dumped.

The real SLM 110 may be a deflection type SLM, i.e, DMD (Digital Micromirror Device) provided by Texas instruments, or diffraction type SLM. The diffraction type SLM may be of different types one is an analog deflection type SLM as used in Micronic Sigma machines, another type is GLV (Grating Light Valve) provided by Silicon Light Machine a third type is piston type pixels in said SLM, i.e., pixels moving up and down. The GLV and piston type pixels work in pairs while the analog deflection type SLM as used in Micronics Sigma machine diffracts the impinging light from single pixels. The spatial light modulators are in this embodiment illustrated to be reflective spatial light modulators. Said reflective SLMs may comprise micromirrors being pixel elements in said modulator, however other reflective spatial light modulators are also applicable as for example modulators based on viscose elastic layers. Different types of SLM's have different incoming and exiting beam angles, in FIG. 1a and FIG. 1b the drawings indicate a beam arrangement used with Texas Instrument SLM's, that have an incoming beam angle to the normal of 12 degrees and a output beam parallel to the normal direction of the SLM surface.

The electromagnetic radiation is according to an example embodiment of the present invention illuminating the real SLM 110 in three different directions 130, 132, 134. Said directions may be steered by different devices typically located at position 142 in FIG. 1b.

Figure 3:
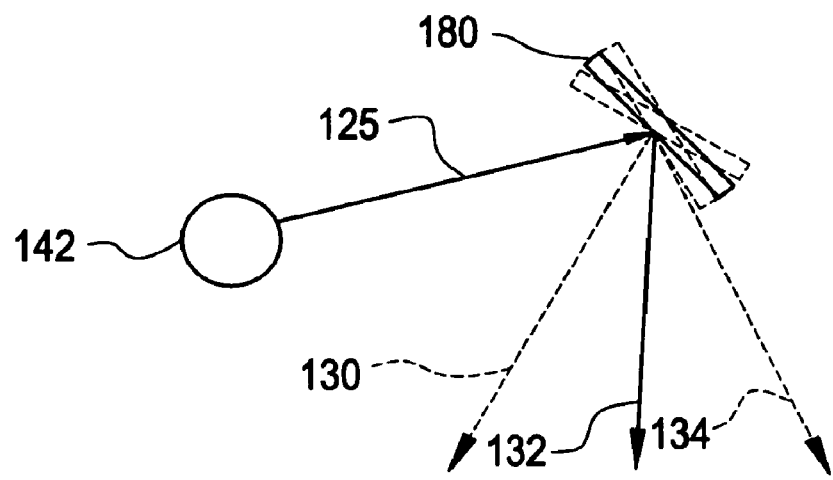
FIG. 3 illustrates a first example embodiment of a fan out device.

A first example embodiment of such a steering device is a deflectable mirror 180 as depicted in FIG. 3. A laser source 142 emits a laser beam 125 which is impinging onto said deflectable mirror 180. The deflectable mirror is capable to relay the electromagnetic radiation into said three different directions 130, 132, 134.

Figure 4:
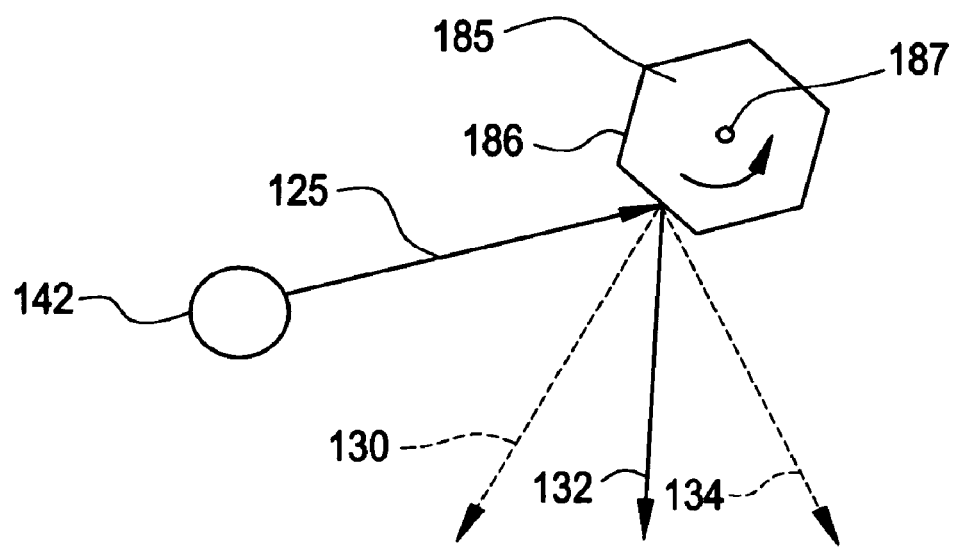
FIG. 4 illustrates another example embodiment of a fan out device.

A second example embodiment of such a steering device is a rotating polygon 185 rotating around a rotating axis 187 as illustrated in FIG. 4. The laser beam 125 may be deflected by one side 186 of said rotating polygon 185. A first position of said rotating polygon may deflect said laser beam in a first direction 130. A second position of said laser beam may deflect said laser beam in a second direction 132 and a third position of said rotating polygon may deflect said laser beam in a third direction 134. Said first second and third direction may be reflected by the same side of said rotating polygon or different sides of said rotating polygon.

Another way of steering the electromagnetic radiation in different directions may be to arrange the laser source on a rotating support. The different illumination direction 130, 132, 134 may be accomplished by simply rotating said support. In yet another example embodiment according to the present invention said different illumination directions 130, 132, 134 may be accomplished by simply using different laser sources having an appropriate illumination direction. A first laser source is used to create a first image 122, a second laser source is used to create the second image 124 and a third laser source is used to create the third image 126. Said first second and third laser source are pulsed laser sources which are out of sync, i.e., the first laser source will flash when the second and third laser source do not flash, the second laser source will flash when the first and third do not flash and the third laser source will flash when the first and second do not flash. An exposure dose may be changed between the different illumination directions, i.e., SLM image 122 may be exposed by a fist dose, SLM image 124 by a second dose and SLM image 126 by a third dose. This method is especially attractive for high speed SLM's where the image frame rate typically exceeds the possible laser pulse repetition frequency by a factor 3 or more.

The pattern in the real SLM 110 may be equal between different illumination directions 130, 132, 134 or different between at least two different illumination directions.

Figure 5:
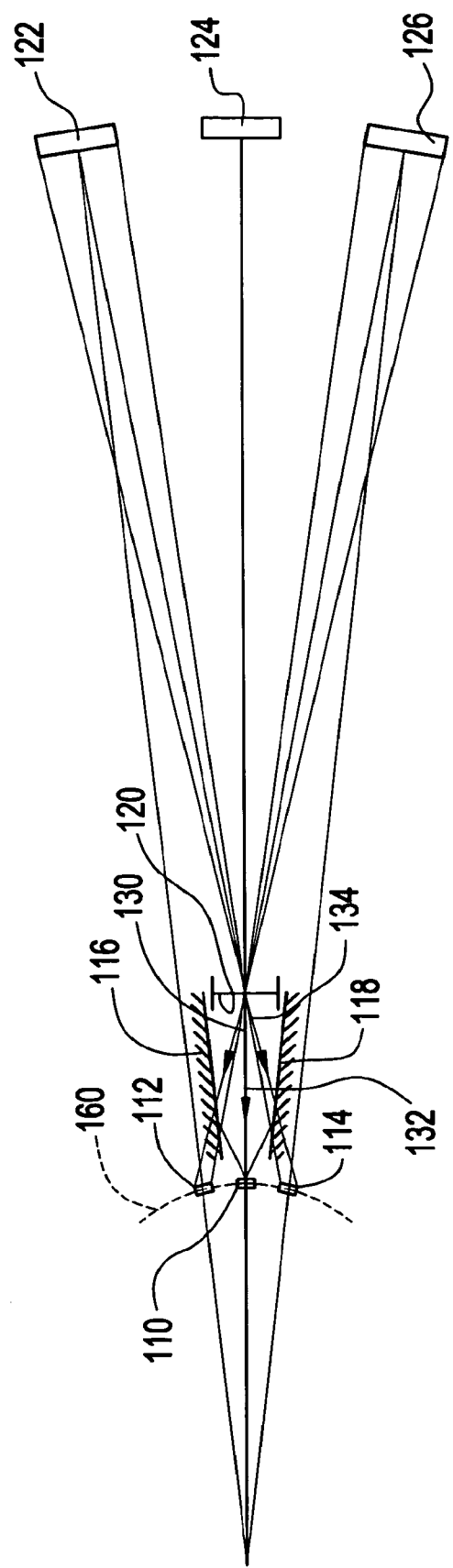
FIG. 5 illustrates a second example embodiment according to the present invention.

FIGS. 5 and 6 illustrates other example embodiments according to the present invention. In FIG. 5 the first mirror 116 and the second mirror 118 have a converging distance in a direction towards the real SLM. In FIG. 6 said first and said second mirrors have a diverging distance in a direction towards the real SLM 110. By tilting one or both mirrors 116, 118 one may correct for some focus errors caused by for instance optical field curvature or other optical errors in the system. In FIG. 5 the real SLM 110, a first virtual SLM position 112 and a second virtual SLM position 114 are forming a curved object plane 160. A first image 122, a second image 124 and a third image 126 are forming a curved image plane 150. As can be seen in FIG. 5 the distance between the real SLM and the virtual SLM positions 112, 114 are smaller than the distance between the corresponding images 122, 124, 126 in the image plane 150, but this is really only related to drawing the ray paths in an explanatory manner that show the cardinal points. In a real embodiment one may have the images 122, 124, 126 reduced in size by the projection optics.

In FIG. 6 said first and said second mirrors have a diverging distance in a direction towards the real SLM 110. In FIG. 6 the real SLM 110, a first virtual SLM position 112 and a second virtual SLM position 114 are forming a curved object plane 160. A first image 122, a second image 124 and a third image 126 are forming a curved image plane 150. As can be seen in FIG. 5 the distance between the real SLM and the virtual SLM positions 112, 114 are larger than the distance between the corresponding images 122, 124, 126 in the image plane 150, but this is again only related to drawing the ray paths in an explanatory manner that show the cardinal points. In a real embodiment one may have the images 122, 124, 126 reduced in size by the projection optics. Parallel mirrors 116, 118 give rise to a flat image plane and a flat object plane. Non parallel mirrors 116, 118 give rise to non flat image plane and non flat object plane.

The mirrors 116, 118 may be movable, i.e., they can be set to a desired angle with respect to an optical axis. One may deflect one mirror 116 or 118 more compare to the other mirror 116 or 118, i.e., thereby creating an asymmetry of the mirrors with respect to the optical axis; this will result in an asymmetric curved image plane. This feature may be used to fine tune the performance/alignment of the virtual source images.

Figure 2:
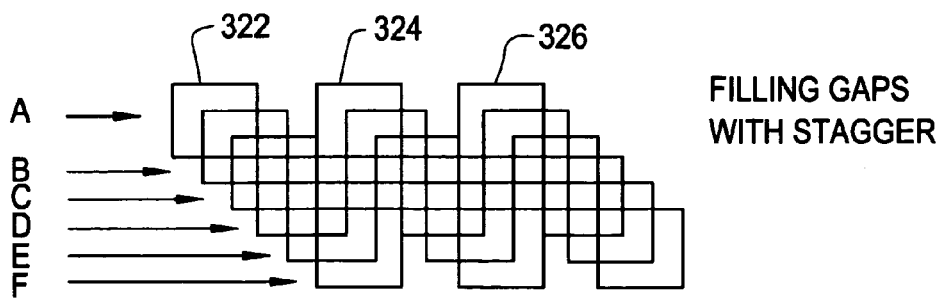
FIG. 2 depicts schematically an example embodiment of a writing principle using the machine as depicted in FIG. 1.

Beams from different SLMs 110, 112, 114 may end up on said workpiece 134 at different locations, adjacent to each other or non-adjacent to each other depending on which writing strategy is chosen. FIG. 2 illustrates a possible arrangement of SLM images from the example embodiment as illustrated in FIG. 1a, 5 or 6.

FIG. 2 illustrates an example embodiment of a multiple pass strategy, individual exposures do not have sufficient intensity for exposing said sensitive layer in itself, but the combination of them will expose said sensitive layer. FIG. 2 illustrates schematically an example embodiment how images 322, 324, 326 from the SLM 110 may be placed on a workpiece, in order to fill in the unavoidable but small gap between the real and virtual image sources. Images 322, 324 and 236 are essentially displaced laterally from a direction of travel of said workpiece. Image 322 may correspond to virtual SLM position 112, image 324 may correspond to real SLM 110 and image 326 may correspond to virtual SLM position 114. A, B, C, D, E and F in FIG. 2 denote the position of the images 322, 324 and 326 for different positions of the workpiece. In the illustrated example embodiment images are partly overlapping each other, but will, once the pattern is complete butt up against each other in an appropriate manner.

The electromagnetic radiation source may be an excimer laser with an output wavelength at 351 mm, 308 mm, 248 mm, or 193 mm. However wavelength longer or shorter than said wavelength may also be applicable.

In one embodiment the radiation intensity from different SLMs, i.e., virtual SLM 112, 114 or real SLM 110 may differ in order to enhance the critical dimension control (CDC). In one embodiment with multipass writing strategy a first pass is written with a first intensity and a second pass with another intensity onto the workpiece, where said first and second passes may belong to the same exposure.

A stage image detector may measure focus, translation, rotation, tilt and curvature/flatness of said SLM. Any deviation of requested specification of said focus, translation, rotation, tilt and curvature/flatness may be adjusted by an appropriate adjustment of the stage, mirrors, and/or a lens arrangement arranged between said spatial light modulator and said workpiece. A part of the alignment of said SLMs may also be performed in a data path, which carries the pattern information to be loaded in the SLM. For instance, a rotational error of said SLM may be performed by rotating the mirrors or the digital description of the pattern to be printed on said workpiece for SLM.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method for patterning a workpiece arranged at an image plane and sensitive to electromagnetic radiation, comprising the actions of:
    emitting electromagnetic radiation onto an object plane,
    distributing the emitted electromagnetic radiation through a series of illuminations directions upon a single area in an object plane, and
    directing said series of illumination directions from at least one spatial light modulator at said single area in said object plane toward said workpiece, wherein at least two consecutive images coming from said at least one spatial light modulator are laterally displaced from each other on said workpiece.

2. The method according to claim 1, wherein said series of illumination directions originate from a single electromagnetic radiation source.

3. The method according to claim 1, wherein said series of illumination directions originate from more than one electromagnetic radiation source.

4. The method according to claim 1, wherein said electromagnetic radiation is distributed upon said object plane in at least two different illumination directions by a tilting or oscillating mirror.

5. The method according to claim 1, wherein said electromagnetic radiation is distributed upon said object plane in at least two different illumination directions by a rotating prism.

6. The method according to claim 1, wherein said illumination directions are distributed in sequence upon said at least one spatial light modulator.

7. The method according to claim 1, wherein said illumination directions are impinged simultaneously onto said at least one spatial light modulator.

8. The method according to claim 1, wherein said images are displaced laterally from a direction of travel of said workpiece.

9. The method according to claim 1, further comprising the action of providing a mirror arrangement between said device to distribute electromagnetic radiation and said at least one spatial light modulator.

10. The method according to claim 9, wherein said mirror arrangement is a pair of mirrors spaced apart from each other.

11. The method according to claim 10, wherein said mirrors are in parallel.

12. The method according to claim 10, wherein said mirrors have reflective surfaces perpendicular to a surface of the SLM.

13. The method according to claim 9, wherein said mirrors are non parallel.

14. The method according to claim 9, wherein said device to distribute said electromagnetic radiation upon said object plane in at least two different illumination directions is a revolving laser source.

15. An apparatus for patterning a workpiece arranged at an image plane and sensitive to electromagnetic radiation, comprising:
    a device to distribute electromagnetic radiation in at least two different illumination directions upon a single area in an object plane comprising at least one spatial light modulator, wherein said at least two illumination directions give rise to at least two laterally displaced images from said at least one spatial light modulator at said image plane.

16. The apparatus according to claim 15, wherein said at least two illumination directions originate from a single electromagnetic radiation source.

17. The apparatus according to claim 15, wherein said at least two illumination directions originate from more than one laser source.

18. The apparatus according to claim 16, wherein said device to distribute electromagnetic radiation upon said object plane in at least two different illumination directions is a tiltable mirror.

19. The apparatus according to claim 16, wherein said device to distribute electromagnetic radiation upon said object plane in at least two different illumination directions is a rotatable prism.

20. The apparatus according to claim 15, wherein said illumination directions are distributed in sequence upon said at least one spatial light modulator.

21. The apparatus according to claim 15, wherein said illumination directions are impinged simultaneously onto said at least one spatial light modulator.

22. The apparatus according to claim 15, wherein said images are displaced laterally from a direction of travel of said workpiece.

23. The apparatus according to claim 15, further comprising a mirror arrangement arranged between said device to distribute electromagnetic radiation and said at least one spatial light modulator.

24. The apparatus according to claim 17, wherein said mirror arrangement is a pair of mirrors spaced apart from each other.

25. The apparatus according to claim 18, wherein said mirrors are in parallel.

26. The apparatus according to claim 19, wherein said mirrors have reflective surfaces perpendicular to a surface of the SLM.

27. The apparatus according to claim 18, wherein said mirrors are non parallel.

28. The apparatus according to claim 15, wherein said device to distribute said electromagnetic radiation upon said object plane in at least two different illumination directions is a revolving laser source.

* * * * *